United States Patent
Lee

(10) Patent No.: US 8,766,290 B2
(45) Date of Patent: Jul. 1, 2014

(54) MASK ASSEMBLY AND ORGANIC LIGHT EMITTING DIODE DISPLAY MANUFACTURED USING THE SAME

(71) Applicant: Samsung Display Co., Ltd, Yongin (KR)

(72) Inventor: Sang-Shin Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/972,175

(22) Filed: Aug. 21, 2013

(65) Prior Publication Data

US 2013/0334515 A1    Dec. 19, 2013

Related U.S. Application Data

(62) Division of application No. 13/491,179, filed on Jun. 7, 2012.

(30) Foreign Application Priority Data

Nov. 30, 2011    (KR) .................. 10-2011-0126931

(51) Int. Cl.
*H01L 33/00*    (2010.01)

(52) U.S. Cl.
USPC .......... 257/88; 257/59; 257/72; 257/E27.121; 257/E21.023; 313/504

(58) Field of Classification Search
USPC ............... 257/88, 59, 72, E27.121, E21.023; 313/504
See application file for complete search history.

(56) References Cited

U.S. PATENT DOCUMENTS

| 6,496,973 | B1 | 12/2002 | Kusuda et al. | |
|---|---|---|---|---|
| 8,258,691 | B2 * | 9/2012 | Lee et al. | 313/504 |
| 2006/0238120 | A1 * | 10/2006 | Miller et al. | 313/506 |
| 2011/0133636 | A1 * | 6/2011 | Matsuo et al. | 313/504 |

FOREIGN PATENT DOCUMENTS

| JP | 2010-090415 | 4/2010 |
|---|---|---|
| KR | 10-0659057 | 12/2006 |
| KR | 10-2011-0082414 | 7/2011 |
| KR | 10-2011-0090014 | 8/2011 |
| KR | 10-2011-0090200 | 8/2011 |

OTHER PUBLICATIONS

Notice of Allowance (Paper No. 130816179) mailed on Aug. 23, 2013 of U.S. Appl. No. 13/491,179, filed Jun. 7, 2012 (the parent application).

* cited by examiner

*Primary Examiner* — Tu-Tu Ho
(74) *Attorney, Agent, or Firm* — Robert E. Bushnell, Esq.

(57) ABSTRACT

A mask assembly includes a frame forming an opening, and a plurality of unit masks which form a plurality of deposition openings, the longitudinal ends of the unit masks being fixed to the frame. At least two adjacent ones of the plurality of unit masks have deposition recesses formed on both sides facing each other. The width of the deposition recesses along a width direction of the unit masks is equal to or greater than the width of the deposition openings along the width direction of the unit masks.

6 Claims, 10 Drawing Sheets

MASK ASSEMBLY AND ORGANIC LIGHT EMITTING DIODE DISPLAY MANUFACTURED USING THE SAME

CLAIM OF PRIORITY

This application makes reference to, incorporates the same herein, and claims all benefits accruing under 35 U.S.C. §119 from an application earlier filed in the Korean Intellectual Property Office on the 30 Nov. 2011 and there duly assigned Serial No. 10-2011-0126931. Furthermore, this application is filed pursuant to 35 U.S.C. §121 as a Divisional application of Applicants' patent application Ser. No. 13/491,179 filed in the U.S. Patent & Trademark Office on 7 Jun. 2012, and assigned to the assignee of the present invention. All benefits accruing under 35 U.S.C. §120 from the aforesaid present application Ser. No. 13/491,179 are also claimed

BACKGROUND OF THE INVENTION

1. Field of the Invention

The present invention relates to a mask assembly. More particularly, the present invention relates to a mask assembly for thin film deposition, and an organic light emitting diode display manufactured using the same.

2. Description of the Related Art

An organic light emitting diode display has self-luminance characteristics, and exhibits high-quality characteristics such as low power consumption, high luminance, high response speed, etc. The organic light emitting diode display has a structure in which an organic emission layer is disposed between a pixel electrode and a common electrode, and each subpixel includes a pixel electrode and an organic emission layer.

The organic emission layer is formed by a deposition method using a mask assembly. The mask assembly includes band-shaped unit masks having a plurality of deposition openings in correspondence to the organic emission layer and a frame for supporting the unit masks. The unit masks are fixed to the frame by a tensile force applied to the unit masks along a lengthwise direction, and hence are prevented from hanging down by self weight. Such a split-type mask assembly is advantageous in the manufacture of a large-sized organic light emitting diode display.

The above information disclosed in this Background section is only for enhancement of an understanding of the background of the invention, and therefore it may contain information that does not form the prior art that is already known in this country to a person of ordinary skill in the art.

SUMMARY OF THE INVENTION

The present invention provides a mask assembly which can increase the deposition quality of an organic emission layer, and an organic light emitting diode display manufactured using the same.

An exemplary embodiment of the present invention provides a mask assembly including: a frame forming an opening; and a plurality of unit masks which form a plurality of deposition openings, both longitudinal ends of the unit masks being fixed to the frame. At least two adjacent ones of the plurality of unit masks have deposition recesses formed on both sides facing each other, and the width of the deposition recesses along the width direction of the unit masks is equal to or greater than the width of the deposition openings along the width direction of the unit masks.

Each of the deposition openings may include long sides parallel to the width direction of the unit masks and short sides parallel to the lengthwise direction of the unit masks. The distance between the deposition openings along the width direction of the unit masks may be smaller than the distance between the deposition openings along the lengthwise direction of the unit masks.

The deposition recesses may be positioned in parallel with the plurality of deposition openings along the width direction of the unit masks. Two deposition recesses formed in at least two unit masks may have the same shape and the same size, and may be positioned in parallel with each other along the width direction of the unit masks.

The deposition openings and the deposition recesses may be surrounded by inclined sidewalls, and the shape of one sidewall of the deposition recesses along the width direction of the unit masks may be identical to the shape of the sidewalls of the deposition openings along the width direction of the unit masks.

Each of the unit masks may include one surface facing a deposition surface and the opposite surface thereof, and the size of the deposition openings and deposition recesses observed on the one surface may be greater than the size of the deposition openings and deposition recesses observed on the opposite surface.

The width w1 of the deposition recesses along the width direction of the unit masks may satisfy the following condition:

$$w2 < w1 \leq w2 + d1/2$$

where w2 indicates the width of the deposition openings along the width direction of the unit masks, and d1 indicates the distance between the deposition openings along the width direction of the unit masks.

The plurality of deposition openings and deposition recesses may be positioned in the area corresponding to the opening of the frame.

The unit masks may be used for the deposition of organic emission layers in correspondence to subpixels of first, second and third colors, may be fixed to the frame by the tensile force applied along the lengthwise direction, and may be disposed such that the tensile direction is orthogonal to the arrangement direction of the subpixels of the same color. The plurality of deposition openings and deposition recesses may be positioned in correspondence to the subpixels of any one of the first, second and third colors.

An exemplary embodiment of the present invention provides an organic light emitting diode display including pixel electrodes, organic emission layers and a common electrode which are positioned on a substrate, the organic emission layers including: first organic emission layers positioned in correspondence to one subpixel; and second organic emission layers positioned across two subpixels.

The organic emission layers may realize any one of a plurality of different colors. Organic emission layers of the same color may be positioned in a row along a first direction, and organic emission layers of different colors may be positioned alternately along a second direction orthogonal to the first direction. The second organic emission layers each may be positioned across two adjacent subpixels along the first direction.

The length of the second organic emission layers may be more than two times the length of the first organic emission layer. The length L2 of the second organic emission layer along the first direction may be represented by the following equation:

$$L2 = 2L1 + d3$$

where L1 indicates the length of the first organic emission layers along the first direction, and d3 indicates the distance between the first organic emission layers along the first direction.

A thin film layer may be positioned at the center of the second organic emission layers along the second direction.

The mask assembly according to the present exemplary embodiment allows the sidewalls of the deposition openings and the sidewalls of the deposition recesses to have a sufficient inclination. As a result, the deposition quality of the organic emission layers in the entire organic light emitting diode display can be improved.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE EMBODIMENTS

The present invention will be described more fully hereinafter with reference to the accompanying drawings, in which exemplary embodiments of the invention are shown. As those skilled in the art will realize, the described embodiments may be modified in various different ways, all without departing from the spirit or scope of the present invention.

Figure 1:
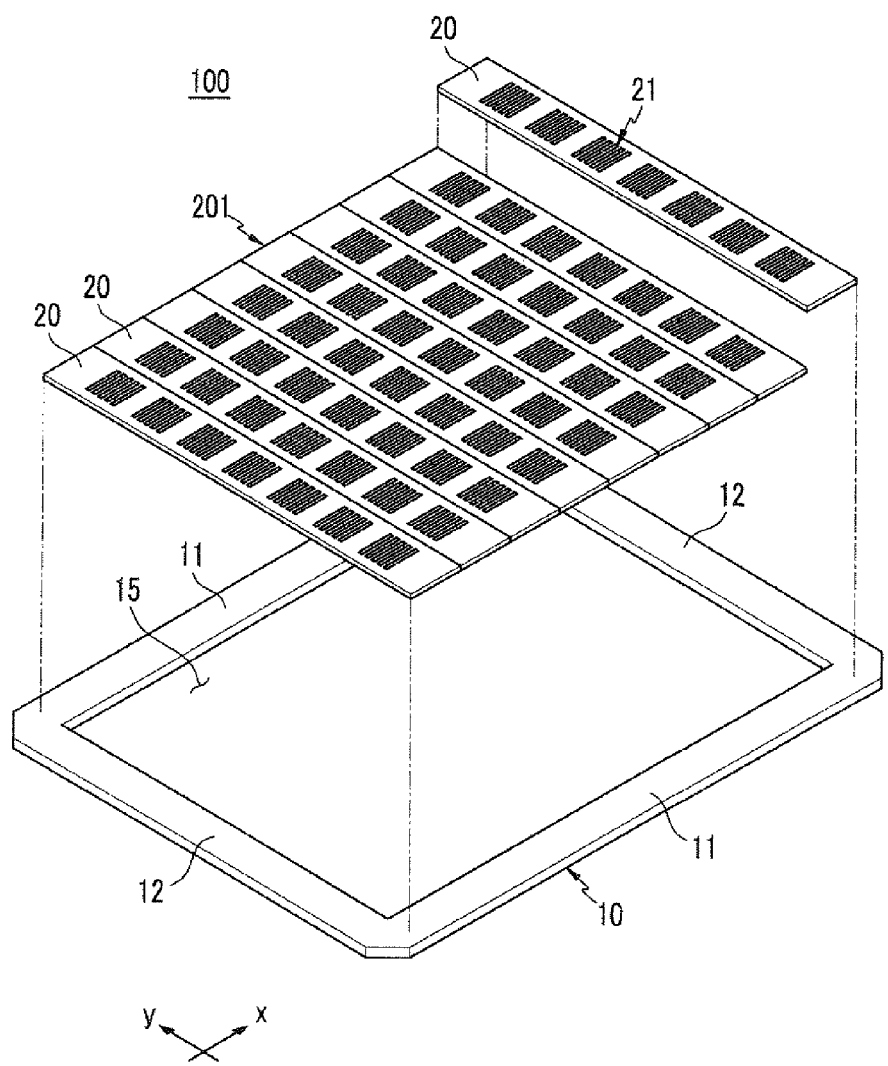
FIG. 1 is an exploded perspective view of a mask assembly according to an exemplary embodiment of the present invention.
Figure 2:
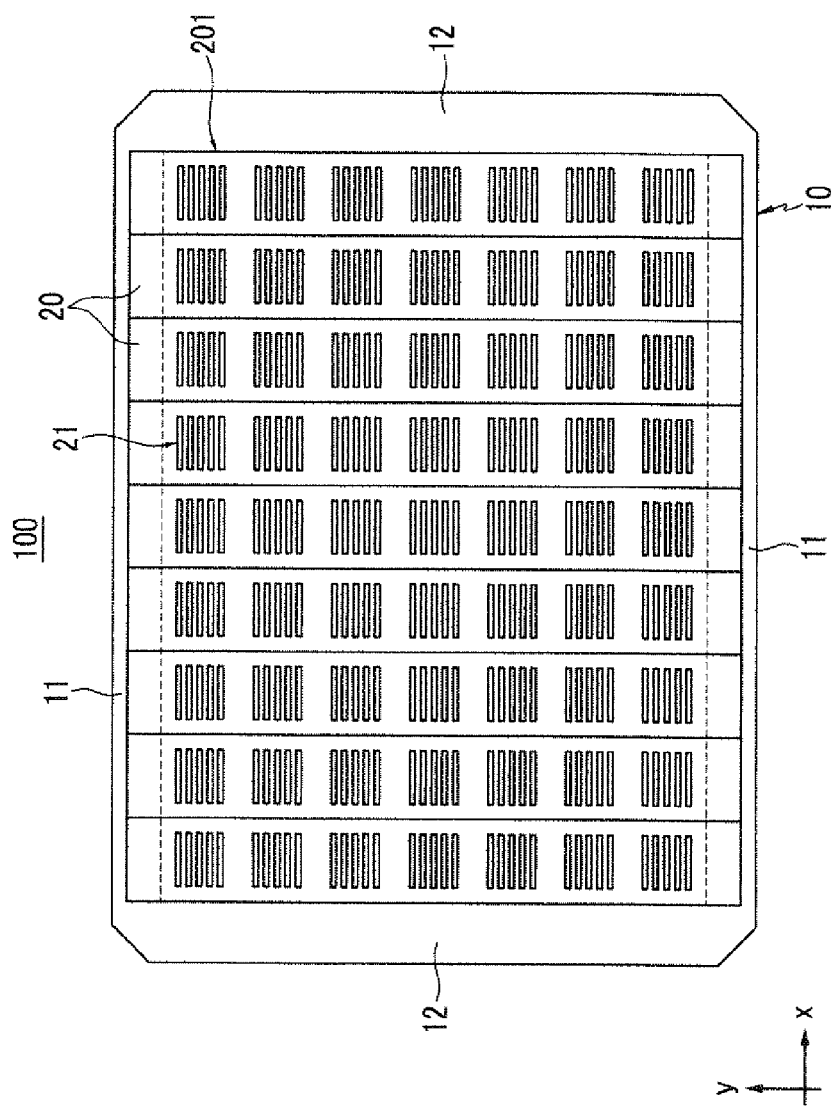
FIG. 2 is a plan view of the mask assembly according to the exemplary embodiment of the present invention.

FIG. 1 is an exploded perspective view of a mask assembly according to an exemplary embodiment of the present invention; and FIG. 2 is a plan view of the mask assembly according to the exemplary embodiment of the present invention.

Referring to FIG. 1 and FIG. 2, the mask assembly 100 of the present exemplary embodiment includes a frame 10 having an opening portion 15 and band-shaped unit masks 20, both ends of which are fixed to the frame 10. Each unit mask 20 has a plurality of deposition openings 21, and is fixed to the frame 10 by a tensile force applied to the unit mask 20 along the lengthwise direction, and hence is prevented from hanging down by self weight.

The frame 10 includes a pair of first support portions 11 arranged in parallel with each other and a pair of second support portions 12 orthogonal to the first support portions 11. The first support portions 11 may be longer than the second support portions 12. With both ends being fixed to the first support portions 11, the unit masks 20 are disposed in parallel with the second support portions 12. The frame 10 requires sufficient rigidity because the unit masks 20, being in a tension state, are fixed to the frame 10.

The unit masks 20 are gathered to form one mask 201 for deposition. The parts of the unit masks 20, other than both end parts fixed to the frame 10, are all positioned on the opening portion 15 of the frame 10. Accordingly, in a deposition process to be described later, the unit masks 20 are disposed between a substrate and a deposition source, thus enabling the deposition of an organic emission layer using the deposition openings 21.

The unit masks 20 are formed together with deposition recesses to be described below. In FIG. 1 and FIG. 2, the illustration of the deposition recesses is omitted for the convenience of description.

Figure 3:
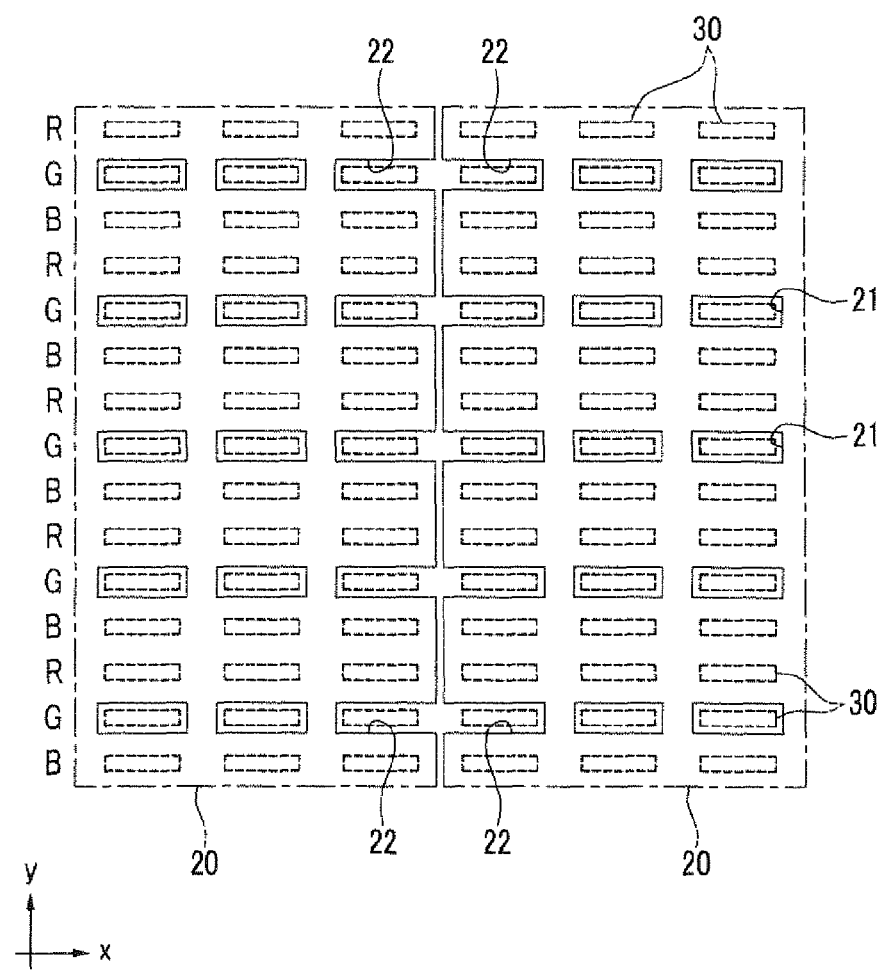
FIG. 3 is a top plan view showing two unit masks of the mask assembly shown in FIG. 1 and subpixels of an organic light emitting diode display.
Figure 4:
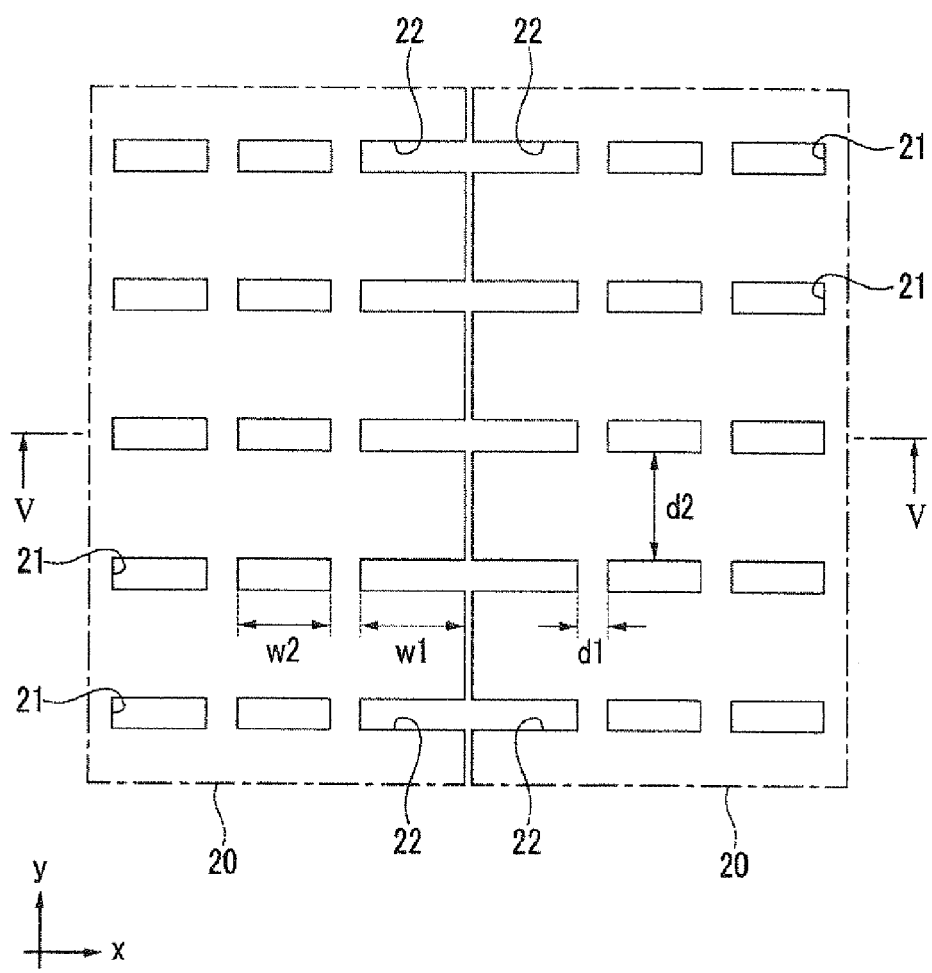
FIG. 4 is a top plan view of the unit masks shown in FIG. 3.

FIG. 3 is a top plan view showing two unit masks of the mask assembly shown in FIG. 1 and subpixels of an organic light emitting diode display; and FIG. 4 is a top plan view of the unit masks shown in FIG. 3.

Referring to FIG. 3 and FIG. 4, the organic light emitting diode display includes a plurality of pixels, and each pixel includes subpixels 30 of three colors. The three colors may include red(R), green(G) and blue(B). Subpixels of the same color are positioned in a row along a first direction (x-axis direction of FIG. 3), and subpixels 30 of different colors are positioned alternately along a second direction (y-axis direction of FIG. 3) orthogonal to the first direction.

Typically, the unit masks 20 are positioned such that their tensile direction (lengthwise direction) is consistent with the arrangement direction of subpixels of the same color. However, the unit masks 20 may be disposed in the reverse manner if necessary. In the mask assembly 100 of the present exemplary embodiment, the unit masks 20 are positioned such that their tensile direction is orthogonal to the arrangement direction (first direction) of the subpixels 30 of the same color.

In FIG. 3, the tensile direction of the unit masks 20 is the second direction (y-axis direction), and the arrangement direction of the subpixels 30 of the same color is the first direction (x-axis direction). Each unit mask 20 has deposition openings 21 corresponding to the subpixels 30 of one color among the subpixels 30 of the three colors.

Each of the deposition openings 21 may be formed in an approximately rectangular shape having long sides and short sides. The long sides of the deposition openings 21 are consistent with the width direction (x-axis direction) of the unit masks 20, and the short sides thereof are consistent with the lengthwise direction (y-axis direction) of the unit masks 20. Also, the distance d1 (see FIG. 4) between the deposition openings 21 along the first direction (x-axis direction) is less than the distance d2 (see FIG. 4) between the deposition openings 21 along the second direction (y-axis direction).

At least two adjacent ones of the plurality of unit masks 20 have deposition recesses 22 formed on both sides facing each other. The deposition recesses 22 are not fully surrounded by the unit masks 20, but are opened toward the sides of the unit masks 20. A predetermined gap may exist between two adjacent unit masks 20.

The deposition recesses 22 are positioned in parallel with the deposition openings 21 along the first direction (x-axis direction). Also, the deposition recesses 22 formed in one unit mask 20 and the deposition recesses 22 formed in another unit mask 22 have the same shape and the same size, and are positioned in parallel with each other along the first direction (x-axis direction).

The width w1 (see FIG. 4) of the deposition recesses 22 along the width direction of the unit masks 20 is equal to or greater than the width w2 (see FIG. 4) of the deposition openings 21 along the width direction of the unit masks 20. At this point, two adjacent unit masks 20 cannot overlap with each other. Thus, the width w1 of the deposition recesses 22 is set to satisfy the following condition (1):

$$w2 < w1 \leq w2 + d1/2 \qquad (1)$$

where d1 indicates the distance between the deposition openings 21 along the width direction of the unit masks 20.

Accordingly, like the deposition openings 21, one deposition recess 22 corresponds to one subpixel 30, and is used to deposit an organic emission layer corresponding to this subpixel 30.

As two unit masks 20 have respective deposition recesses 22 formed on both sides facing each other, it is possible to form one organic emission layer positioned across two subpixels 30 by using these two deposition recesses 22 as one deposition opening.

That is, the mask assembly 100 is able to form organic emission layers in correspondence to one subpixel 30 by using a plurality of deposition openings 21, and, at the same time, to form organic emission layers positioned across two subpixels by using two deposition recesses 22. A structure of an organic emission layer formed using the mask assembly 100 of the present exemplary embodiment will be described later.

Figure 5:
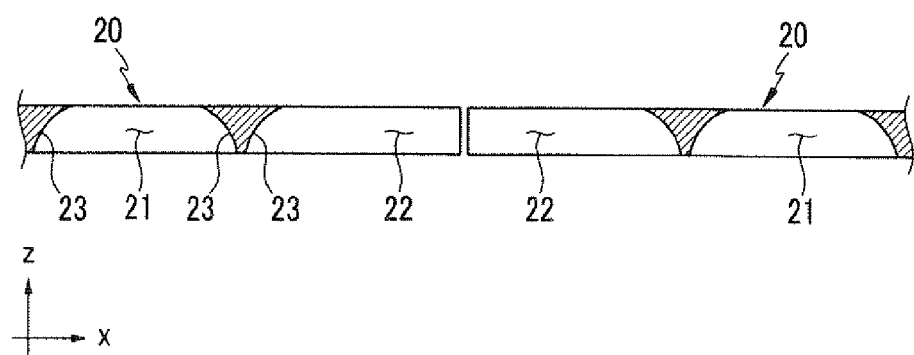
FIG. 5 is a cross-sectional view of unit masks cut away along line V-V of FIG. 4.
Figure 6:
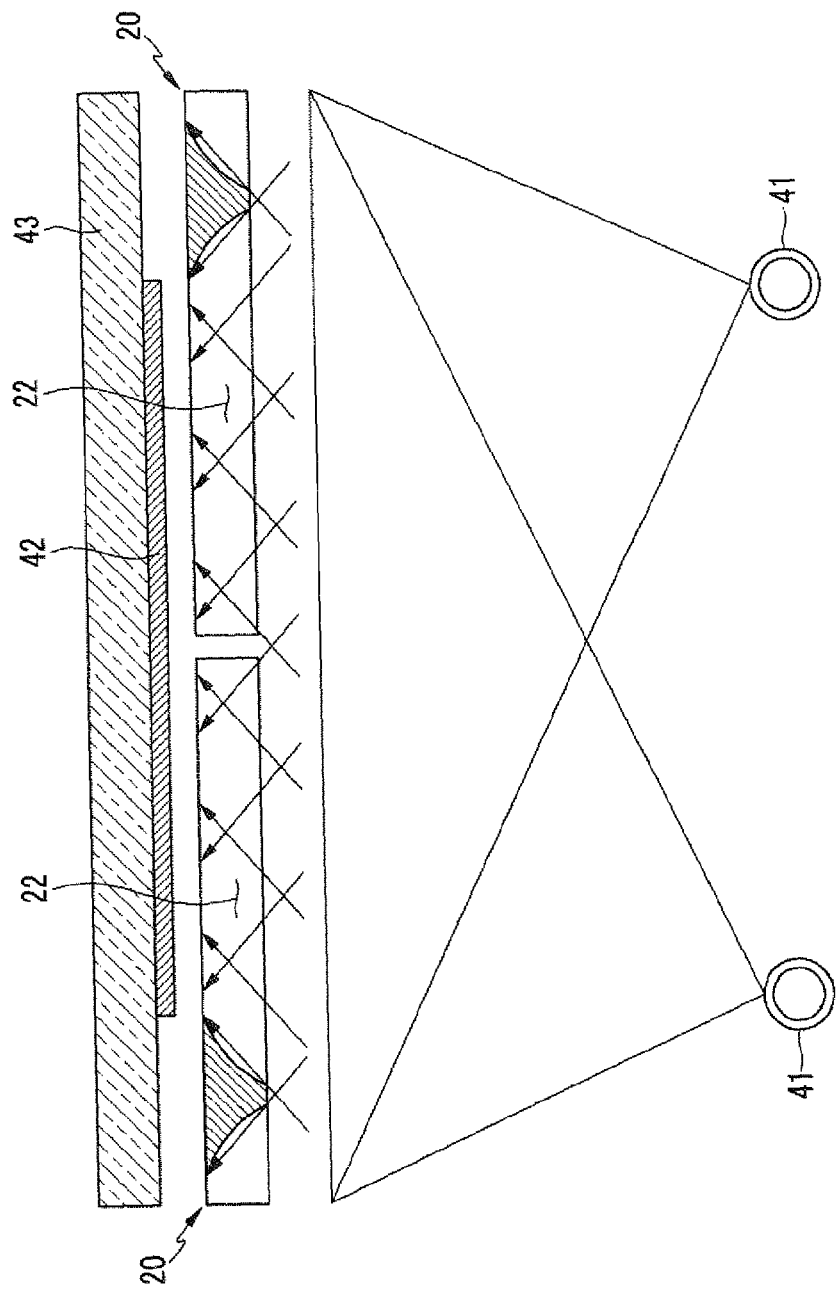
FIG. 6 is a schematic view showing a deposition process of an organic emission layer using the unit masks of FIG. 5.

FIG. 5 is a cross-sectional view of unit masks cut away along line V-V of FIG. 4; and FIG. 6 is a schematic view showing a deposition process of an organic emission layer using the unit masks of FIG. 5.

Referring to FIG. 5 and FIG. 6, in the deposition process, the unit masks 20 are positioned between a deposition source 41 and a substrate 43 where the organic emission layer 42 is to be deposited. The unit masks 20 of this type cause the deposition openings 21 and deposition recesses 22 observed on the top and bottom surfaces of the unit masks 20 to have different sizes from each other by forming sidewalls 23 of the deposition openings 21 and deposition recesses 22 to be inclined.

Specifically, the sizes of the deposition openings 21 and deposition recesses 22 observed on the surface (bottom surface in FIGS. 5 and 6) facing the deposition source 41, among the top and bottom surfaces of the unit masks 20, are larger than the sizes of the deposition openings 21 and deposition recesses 22 observed on the surface (top surface in FIGS. 5 and 6) facing the substrate 43.

Moreover, the shape of one sidewall 23 of the deposition recess is identical to the shape of the sidewalls 23 of the deposition openings 21 with respect to the cross-sectional shape of the unit masks 20 along the first direction (x-axis direction). That is, the inclination of the sidewalls 23 of the deposition opening 21 is identical to the inclination of one sidewall 23 of the deposition recesses 22.

The inclined sidewalls 23 of the deposition openings 21 and deposition recesses 22 are for reducing a shadow effect caused by the organic emission layer 42 deposited with a non-uniform thickness. If the sidewalls 23 of the deposition openings 21 and deposition recesses 22 cannot secure a sufficient inclination, most of the material emitted from the deposition source 41 is bumped against the sidewalls 23, thus failing to be uniformly deposited on the substrate 43. Accordingly, it is important for the sidewalls 23 to secure a sufficient inclination.

Figure 7:
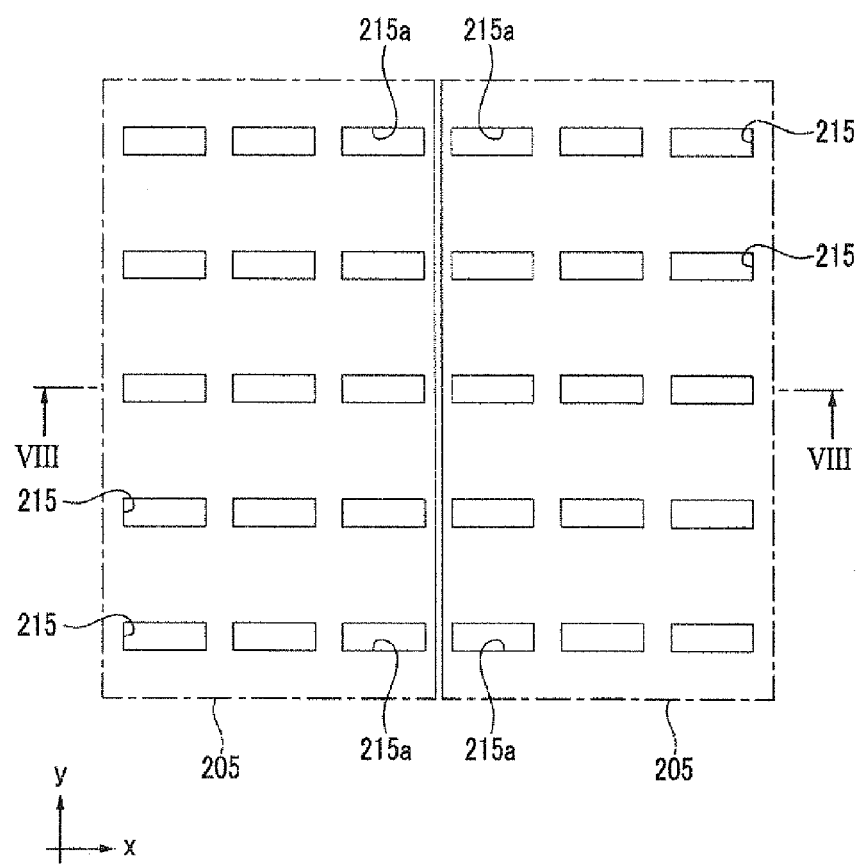
FIG. 7 is a partial enlarged view showing the unit masks of a comparative example in which only deposition openings are provided, but no deposition recesses are provided.
Figure 8:
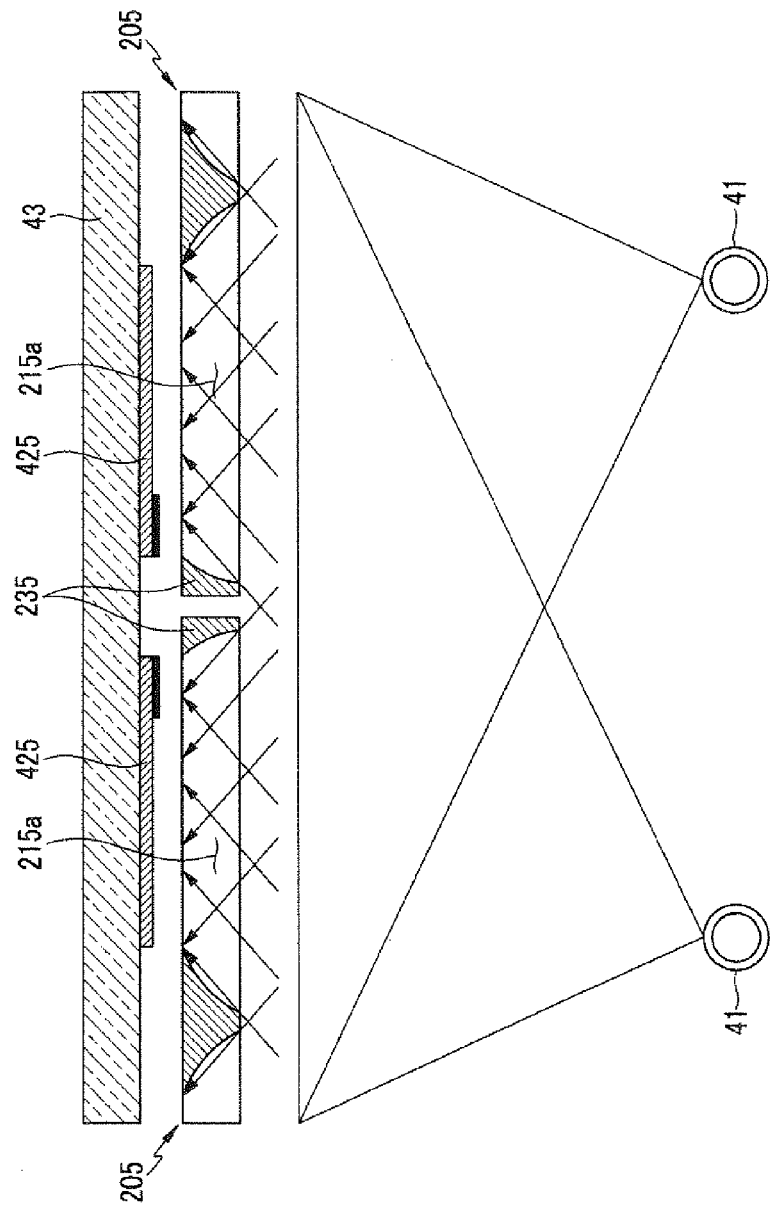
FIG. 8 is a cross-sectional view of the unit masks cut away alone line VIII-VIII of FIG. 7.

FIG. 7 is a partial enlarged view showing the unit masks of a comparative example in which only deposition openings are provided, but no deposition recesses are provided; and FIG. 8 is a cross-sectional view of the unit masks cut away alone line VIII-VIII of FIG. 7.

Referring to FIG. 7 and FIG. 8, the unit masks 205 of the comparative example have deposition openings 215 and 215a, but no deposition recesses under the same condition (in which the tensile direction of the unit masks is orthogonal to the arrangement direction of subpixels of the same color, and the long sides of the deposition openings are consistent with the width direction of the unit masks) as the unit masks 20 of the exemplary embodiment.

As for the unit masks 205 of the comparative example, it is difficult to secure a sufficient distance between both sides of the unit masks 205 and the outermost deposition openings 215a. As a result, it is not possible to achieve a sufficient inclination at one side of the outermost deposition opening 215 facing a side of the unit mask 205.

In FIG. 8, one sidewall 235 of the outermost deposition opening 215a facing the side of the unit mask 205 forms a near vertical inclination. As such, the unit masks of the comparative example suffer a shadow effect in the outermost deposition opening 215, thereby degrading the deposition quality of the organic emission layer 425. In FIG. 8, the regions of the organic emission layer 425 where the shadow effect has occurred are indicated in black line.

Referring again to FIGS. 5 and 6, the unit masks 20 of the present exemplary embodiment can fundamentally prevent the shadow effect that occurs in the comparative example by forming the deposition recesses 22 instead of the outermost deposition openings 215a of the comparative example. That is, it is possible to form the organic emission layer 42 of uniform thickness by using two adjacent deposition openings 22 as one deposition opening, rather than forming the outermost deposition openings 215a.

In this manner, the unit masks 20 of the present exemplary embodiment enable the sidewalls 23 of the deposition openings 21 and deposition recesses 22 to have a sufficient inclination. As a result, the deposition quality of the organic emission layer 42 in the entire organic light emitting diode display can be improved.

Figure 9:
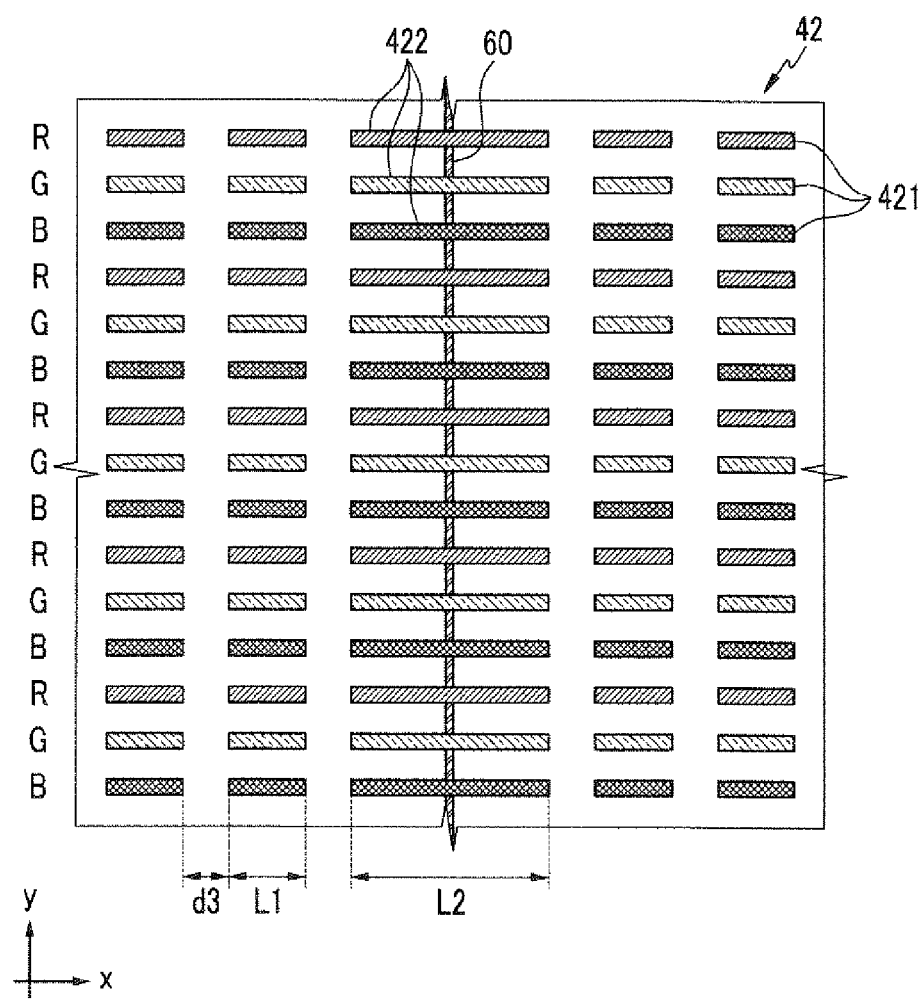
FIG. 9 is a top plan view showing the organic emission layer of the organic light emitting diode display manufactured using the mask assembly of FIG. 1.

FIG. 9 is a top plan view showing an organic emission layer of the organic light emitting diode display manufactured using the mask assembly of FIG. 1.

Referring to FIG. 3 and FIG. 9, the mask assembly 100 is used for the deposition of an organic emission layer 42 of any one of the first, second and third colors in the first position, and is moved to the second position and then used for the deposition of an organic emission layer 42 of another one of the first, second and third colors. Also, the mask assembly 100 is moved to the third position, and is then used for the deposition of an organic emission layer 42 of the remaining one of the first, second and third colors. The first color may be red (R), the second color may be green (G), and the third color may be blue (B).

In the organic light emitting diode display, organic emission layers 42 of the same color are positioned in a row along the first direction (x-axis direction), and organic emission layers 42 of different colors are positioned alternately along the second direction (y-axis direction). The organic emission layers 42 include first organic emission layers 421, each positioned in correspondence to one subpixel, and second organic emission layers 422, each positioned across two adjacent subpixels along the first direction.

The length L2 (see FIG. 9) of the second organic emission layers 422 is two times greater than the length L2 (see FIG. 9) of the first organic emission layers 421. Specifically, the length L2 of the second organic emission layer 422 may be represented by (2L1+d3), where d3 indicates the distance between the first organic emission layers 421. At this point, the lengths L1 and L2 and the distance d3 are all with respect to the first direction (x-axis direction). The width of the first organic emission layer 421 along the second direction (y-axis direction) is equal to the width of the second organic emission layer 422.

Even if the second organic emission layer 422 is positioned across two adjacent subpixels, a pixel electrode (not shown) and a driving circuit part (not shown) are provided separately for each subpixel. Thus, the second organic emission layer 422 can emit light independently for each subpixel.

Meanwhile, a predetermined gap may exist between the two unit masks 20 shown in FIG. 3. Thus, the organic emission layer 42 may be deposited through this gap. A thin film layer 60 generated by this gap is shown in FIG. 9. The thin film layer 60, which is formed by overlapping the organic emission layers 42 of the three colors, is positioned at the center of the second organic emission layers 422 in parallel with the second direction (y-axis direction).

Figure 10:
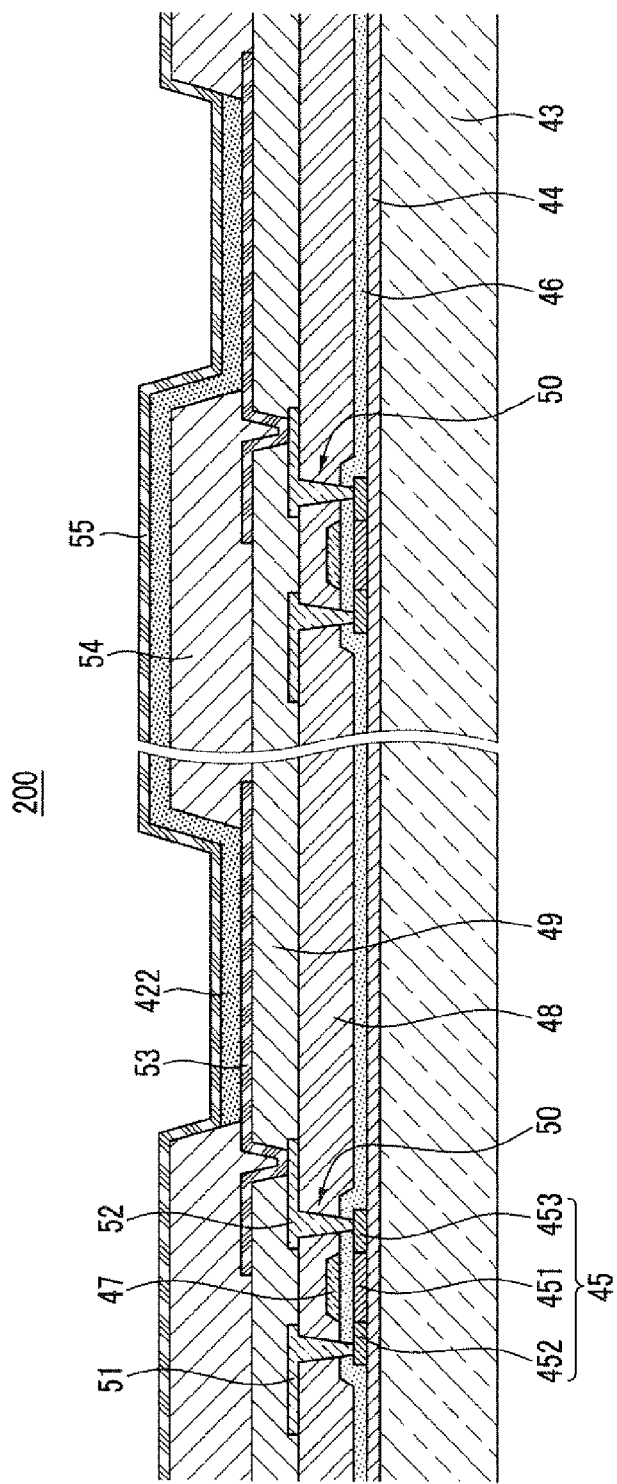
FIG. 10 is a schematic cross-sectional view of the organic light emitting diode display including the second organic emission layers shown in FIG. 9.

FIG. 10 is a schematic cross-sectional view of the organic light emitting diode display including the second organic emission layers shown in FIG. 9.

The organic light emitting diode display 200 is connected to a plurality of signal lines, and includes a plurality of subpixels arranged in an approximate matrix form. FIG. 10 illustrates two subpixels of the plurality of subpixels. Although each subpixel includes a plurality of thin film transistors, only one thin film transistor 50 is illustrated herein for convenience.

Referring to FIG. 10, a buffer layer 44 is formed on the substrate 43, a semiconductor layer 45 is positioned on the buffer layer 44, and a semiconductor layer 45 is positioned on the buffer layer 44. The semiconductor layer 45 includes a channel region 451, a source region 452, and a drain region 453. The source region 452 and the drain region 453 may be doped with a p-type impurity or n-type impurity.

A gate insulating film 46 is formed on the buffer layer 44 while covering the semiconductor layer 45, and a gate electrode 47 is formed on the gate insulating film 46 in correspondence to the channel region 451. Next, an interlayer insulating film 48 is formed on the gate insulating film 46 while covering the gate electrode 47.

A contact hole exposing the source region 452 and the drain region 453 is formed on the interlayer insulating film 48 and the gate insulating film 46. A source electrode 51 connected to the source region 452 via the contact hole and a drain electrode 52 connected to the drain region 453 via the contact hole are formed on the interlayer insulating film 48.

A planarization layer 49 is formed on the interlayer insulating film 48 while covering the source electrode 51 and the drain electrode 52, and a contact hole exposing the drain electrode 52 is formed on the planarization film 49. A pixel electrode 53 connected to the drain electrode 52 is formed on the planarization layer 49, and a pixel defining film 54 is formed on the planarization film 49 while covering the pixel electrode 53. An opening exposing part of the pixel electrode 53 is formed in the pixel defining film 54.

An organic emission layer 422 is formed in the opening of the pixel defining film 54, and a common electrode 55 is formed over the entire pixel defining film 54 while covering the organic emission layer 422. The organic emission layer 422 shown in FIG. 10 is a second organic emission layer positioned across two adjacent subpixels. Either one of the pixel electrode 53 and the common electrode 55 functions as an electron injection electrode, and the other one functions as a hole injection electrode.

The organic emission layer 422 may be formed of an organic material emitting light of any one of red, green and blue, or a mixture of an organic material and an inorganic material. An auxiliary layer for improving the luminous efficiency of the organic emission layer 422 may be formed on the top and bottom of the organic emission layer 422. The auxiliary layer may be at least one of a hole injection layer, a hole transport layer, an electron injection layer, and an electron transport layer.

Either one of the pixel electrode 53 and the common electrode 55 may be formed of a transparent conductive film, and the other one may be formed of a reflective conductive film. The light emitted from the organic emission layer 422 is reflected by the reflective conductive film, passes through the transparent conductive film, and is emitted outside the organic light emitting diode display.

Although the above description has been made with respect to an example in which the organic emission layer 42 realizes red, green and blue, the emission color of the organic emission layer 42 is not limited thereto.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display, comprising pixel electrodes, organic emission layers and a common electrode all positioned on a substrate;
    organic emission layers disposed to emit light of a same color being positioned in a row along a first direction, the organic emission layers disposed to emit light of the same color comprising:
    first organic emission layers positioned in correspondence to one subpixel; and
    second organic emission layers positioned across two subpixels.

2. The organic light emitting diode display of claim 1, wherein organic emission layers of different colors are positioned alternately along a second direction orthogonal to the first direction.

3. The organic light emitting diode display of claim 2, wherein the second organic emission layers each are positioned across two adjacent subpixels along the first direction.

4. The organic light emitting diode display of claim 3, wherein the length of the second organic emission layers is more than two times the length of the first organic emission layers.

5. The organic light emitting diode display of claim 4, wherein the length L2 of the second organic emission layers along the first direction is represented by the following equation:

$$L2 = 2L1 + d3$$

where L1 indicates the length of the first organic emission layers along the first direction, and d3 indicates a distance between the first organic emission layers along the first direction.

6. The organic light emitting diode display of claim 2, wherein a thin film layer is positioned at a center of the second organic emission layers along the second direction.

* * * * *